(12) United States Patent
Chen et al.

(10) Patent No.: US 10,121,886 B2
(45) Date of Patent: Nov. 6, 2018

(54) HIGH POWER SEMICONDUCTOR DEVICE

(71) Applicant: EPISTAR CORPORATION, Hsinchu (TW)

(72) Inventors: Ming-Chin Chen, Hsinchu (TW); Yi-Chih Lin, Hsinchu (TW); Shang-Ju Tu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/664,879

(22) Filed: Jul. 31, 2017

(65) Prior Publication Data

US 2018/0033880 A1    Feb. 1, 2018

(30) Foreign Application Priority Data

Aug. 1, 2016    (TW) .............................. 105124363 A

(51) Int. Cl.
*H01L 29/00*    (2006.01)
*H01L 29/778*    (2006.01)
(Continued)

(52) U.S. Cl.
CPC ...... *H01L 29/7787* (2013.01); *H01L 29/0611* (2013.01); *H01L 29/0847* (2013.01); *H01L 29/0891* (2013.01); *H01L 29/1054* (2013.01); *H01L 29/1066* (2013.01); *H01L 29/2003* (2013.01); *H01L 29/205* (2013.01); *H01L 29/4236* (2013.01); *H01L 29/42316* (2013.01); *H01L 29/66462* (2013.01); *H01L 21/0254* (2013.01); *H01L 21/02458* (2013.01); *H01L 29/41766* (2013.01); *H01L 29/868* (2013.01)

(58) Field of Classification Search
CPC ............ H01L 29/7787; H01L 29/0611; H01L 29/0847; H01L 29/0891; H01L 29/1054; H01L 29/2003; H01L 29/205; H01L 29/4236; H01L 29/66462; H01L 29/868; H01L 21/02458; H01L 21/0254
See application file for complete search history.

(56) References Cited

U.S. PATENT DOCUMENTS 7,202,528 B2 *    4/2007    Sankin ................... H01L 27/098
                                                                257/134
8,154,073 B2 *    4/2012    Aoki .................... H01L 29/0696
                                                                257/330

(Continued)

OTHER PUBLICATIONS

Oka, "AlGaN/GaN Recessed MIS-Gate HFET With High-Threshold-Voltage Normally-Off Operation for Power Electronics Applications", published in IEEE Electron Device Letters (vol. 29, Issue: 7, Jul. 2008 ), retrieved on Jul. 31, 2017 from "http://ieeexplore.ieee.org/document/4558082/", 3 pages.

(Continued)

*Primary Examiner* — Nikolay Yushin
(74) *Attorney, Agent, or Firm* — Ditthavong & Steiner, P.C.

(57) ABSTRACT

This application provides a high power semiconductor device, which is characterized by forming two diodes connected in parallel and a schottky contact on a channel layer to lower the turn-on voltage and turn-on resistance of the high power semiconductor device at the same time and to enhance the breakdown voltage.

12 Claims, 7 Drawing Sheets

(51) Int. Cl.
  *H01L 29/06* (2006.01)
  *H01L 29/08* (2006.01)
  *H01L 29/10* (2006.01)
  *H01L 29/20* (2006.01)
  *H01L 29/205* (2006.01)
  *H01L 29/423* (2006.01)
  *H01L 29/66* (2006.01)
  *H01L 21/02* (2006.01)
  *H01L 29/868* (2006.01)
  *H01L 29/417* (2006.01)

(56) References Cited

U.S. PATENT DOCUMENTS

| 8,785,976 | B2 | 7/2014 | Nakajima et al. | |
| 2006/0113593 | A1* | 6/2006 | Sankin | H01L 27/098 257/341 |
| 2008/0012050 | A1* | 1/2008 | Aoki | H01L 29/0696 257/262 |

OTHER PUBLICATIONS

Bahat-Treidel et al., "Fast-Switching GaN-Based Lateral Power Schottky Barrier Diodes With Low Onset Voltage and Strong Reverse Blocking", published in IEEE Electron Device Letters (vol. 33, Issue: 3, Mar. 2012), retrieved on Jul. 31, 2017 from "http://ieeexplore.ieee.org/document/6127896/", pp. 357-359, 3 pages.

Lee et al., "Low Turn-On Voltage AlGaN/GaN-on-Si Rectifier With Gated Ohmic Anode", published in IEEE Electron Device Letters (vol. 34, Issue: 2, Feb. 2013), retrieved on Jul. 31, 2017 from "http://ieeexplore.ieee.org/document/6413168/", pp. 214-216, 3 pages.

Baliga et al., "The merged P-I-N Schottky (MPS) rectifier: A high-voltage, high-speed power diode", published in Electron Devices Meeting, 1987 International, retrieved on Jul. 31, 2017 from "http://ieeexplore.ieee.org/document/1487472/", 5 pages.

* cited by examiner

HIGH POWER SEMICONDUCTOR DEVICE

REFERENCE TO RELATED APPLICATION

The present application claims the right of priority based on TW application Serial No. 105124363, filed on Aug. 1, 2016, and the content of which is hereby incorporated by reference in its entirety.

FIELD OF THE INVENTION

The present application is related to a high power semiconductor device, and more particularly, to a high power semiconductor device with high electron mobility.

DESCRIPTION OF THE PRIOR ART

A high electron mobility transistor is a heterostructure including two materials with different energy band gap, for example, a heterostructure consisting of an aluminum gallium nitride layer and a gallium nitride layer that can cause a spontaneous polarization and a piezoelectric polarization. Under a condition that the heterostructure is undoped, a two dimensional electron gas with high concentration is formed at an interface between the aluminum gallium nitride layer and the gallium nitride layer, so that a speed of carriers is increased that results in a lower channel resistance. In addition, concentrations of carriers are also increased due to the discontinuous energy band of the heterostructure and the effect of the piezoelectric polarization. When the concentrations of two dimensional electron gases are increased, higher than $10^{13}$ cm$^{-2}$ for example, the current density is increased accordingly. Additionally, gallium nitride has a high electron mobility of $2.5 \times 10^5$ m/s and a breakdown voltage of 5 MV/cm, and thus a high electron mobility transistor including a material of gallium nitride can be operated at high temperature, high pressure, high current density, and high frequency. While operating a high electron mobility transistor, a high electric field concentrates at edges of schottky metal contacts of a gate, which results in more strain in an aluminum gallium nitride layer of the transistor. Further, when the transistor operates under a drain-to-gate threshold voltage, defects occur due to the reasons above. Additionally, these defects become deep-level traps that generate electrons tunnels which cause significant leakage currents. Therefore, a breakdown of the transistor occurs earlier than expected and the breakdown voltage of the transistor cannot be increased.

SUMMARY OF DISCLOSURE

The present application is to provide a high power semiconductor device, which is characterized by forming two diodes electrically connected in parallel and a schottky contact on a channel layer to lower the turn-on voltage and turn-on resistance at the same time so as to increase its breakdown voltage.

The present application is to provide a high power semiconductor device including: a substrate; a channel layer formed on the substrate and including a first region, a second region, and a third region; a first barrier layer formed on the first region of the channel layer; a first cap layer which can be a semiconductor layer, has a first conductivity type, and is formed on the first barrier layer; a first electrode formed on the first barrier layer; a second electrode formed on the first cap layer; a second barrier layer formed on the second region of the channel layer; a second cap layer which can be a semiconductor layer, has a first conductivity type, and is formed on the second barrier layer; a third electrode formed on the second barrier layer; a fourth electrode formed on the second cap layer; a trench disposed between the first barrier layer and the second barrier layer, wherein the trench exposes the third region of the channel layer, the trench includes a bottom wall, and the bottom wall includes the third region of the channel layer; and a connecting portion covering the bottom wall of the trench, electrically connected with the second electrode and the fourth electrode, and forming a schottky contact with the third region of the channel layer.

The present application is to provide a high power semiconductor device including: a substrate; a first PIN diode structure disposed on the substrate; a second PIN diode structure disposed on the substrate; and a schottky-interface structure disposed on the substrate wherein the first PIN diode structure, the second diode PIN structure, and the schottky-interface structure are electrically connected in parallel.

The present application is to provide a high power semiconductor device including: a substrate; a channel layer disposed on the substrate; a barrier layer on the channel layer; a dielectric layer disposed on the channel layer; a first semiconductor gate structure disposed on the barrier layer; a metal-insulator-semiconductor gate structure having a recess and disposed on the dielectric layer; a second semiconductor gate structure disposed on the barrier layer; and a connecting portion electrically connected with the first semiconductor gate structure, the metal-insulator-semiconductor gate structure, and the second semiconductor gate structure in parallel.

BRIEF DESCRIPTION OF THE DRAWINGS

The present application is illustrated by way of example and not limited by the figures of the accompanying drawings in which same references indicate similar elements. Many aspects of the disclosure can be better understood with reference to the following drawings.

DETAILED DESCRIPTION OF THE PREFERRED EMBODIMENTS

Figure 1A:
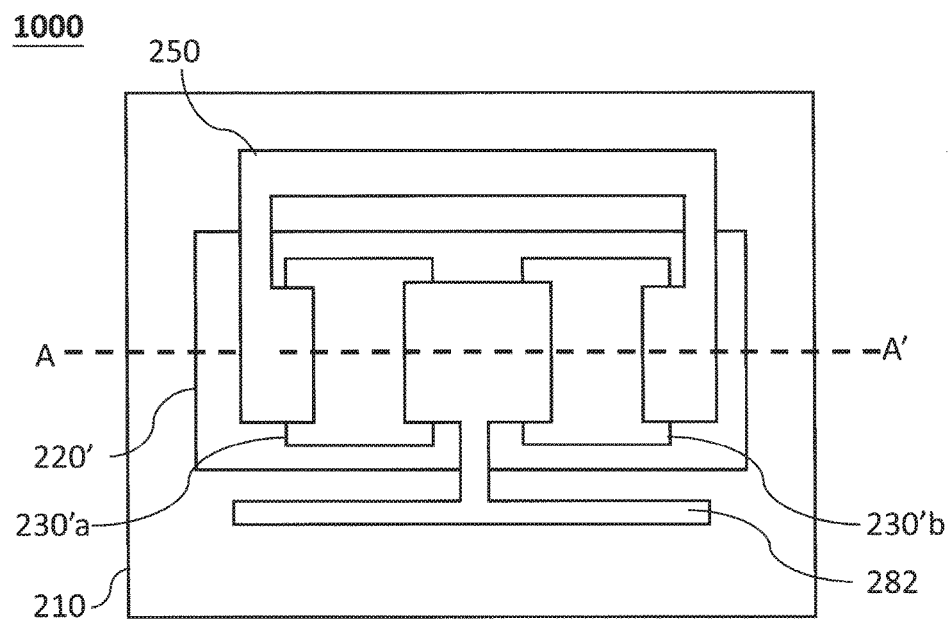
FIG. 1A shows a top view of a high power semiconductor device 1000 in accordance with a first embodiment of the present application.

In order to make the aforementioned features and advantages of the present application more comprehensible, embodiments accompanying figures are described in details below.

A description accompanied with drawings is provided in the following to explain embodiments of the present application. However, the invention may still be implemented in many other different forms and should not be construed as limited to the embodiments described herein. In the drawings, for the purpose of clarity, the sizes and relative sizes of each layer and region in the drawings may be illustrated in exaggerated proportions.

FIG. 1A shows a top view of a high power semiconductor device 1000 in accordance with a first embodiment of the present application. FIG. 2F shows a top view taken along a line A-A' of the high power semiconductor device 1000 as shown in FIG. 1A.

A description accompanied with FIG. 2A to FIG. 2F is provided in the following to explain a manufacturing process of the high power semiconductor device 1000 in accordance with the first embodiment of the present application.

Figure 2A:
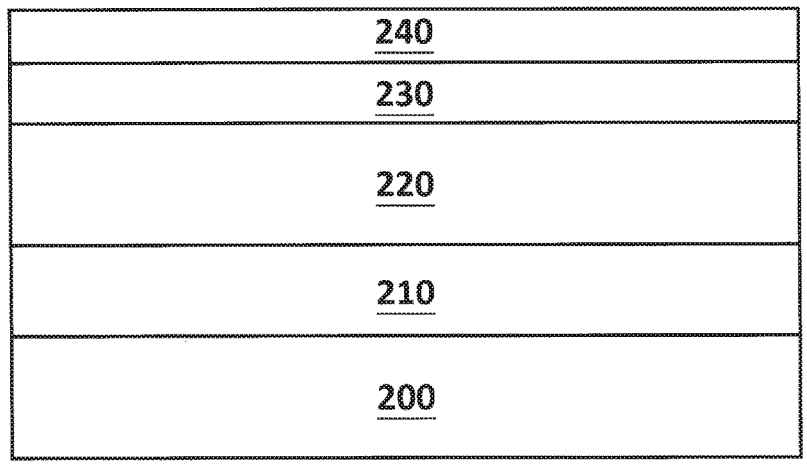
FIG. 2A to FIG. 2F show a cross-sectional view of the high power semiconductor device 1000 in accordance with the first embodiment of the present application.

In FIG. 2A, a substrate 2000 is provided, and a buffer layer 210, a channel layer 220, a barrier layer 230, and a cap layer 240 which can be a semiconductor layer with a conductivity type are deposited in sequence on the substrate 2000 by an epitaxial process. Herein, the substrate 200 can be a conductive substrate or an insulating substrate and a material of the substrate 200 can include sapphire, silicon carbide, or silicon. A material of the buffer layer 210 can include a IIIA-VA material, for example, aluminum nitride, gallium nitride, aluminum gallium nitride, or carbon-doped gallium nitride. The buffer layer 210 can reduce lattice defects of the channel layer 220 and the barrier layer 230. In the embodiment, a thickness of the channel layer ranges between 50-300 nm. The channel layer 220 is formed on the buffer layer 210, has a first energy gap, and can be an intentionally-doped layer or an intrinsic semiconductor layer. A material of the channel layer 220 can include $In_xGa_{(1-x)}N$ where $0 \le x < 1$, for example, gallium nitride. A thickness of the barrier layer 230 ranges between 20-50 nm. Additionally, the barrier layer 230 has a second energy gap greater than the first energy gap. That is to say a lattice constant of the barrier layer 230 is smaller than a lattice constant of the channel layer 220. The barrier layer 230 can be an intentionally-doped layer or an intrinsic semiconductor layer. A material of the barrier layer 230 can include $Al_yIn_zGa_{(1-z)}O$ where $0 < y < 1$ and $0 \le z < 1$, for example, aluminum gallium nitride. The cap layer 240 has a conductivity type including n-type or p-type. In the embodiment, the cap layer 240 can be a p-type semiconductor layer. A thickness thereof ranges between 1-50 nm, for example, 3 nm and a material thereof can include p-type $Al_yIn_zGa_{(1-z)}N$, where $0 < y < 1$ and $0 \le z < 1$, for example, a p-type gallium nitride layer.

Figure 2B:
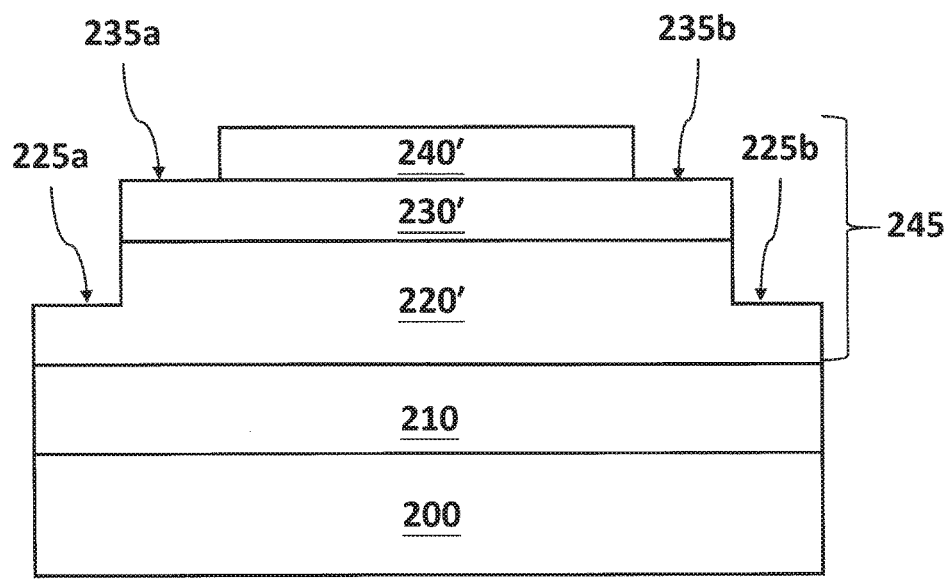

In FIG. 2B, the channel layer 220, the barrier layer 230, and the cap layer 240 are patterned by lithography process and etching process to form a semiconductor platform 245 which is constructed from a patterned channel layer 220', a patterned barrier layer 230', and a patterned cap layer 240'. Additionally, portions of a first surface 225a and a second surface 225b on two sides of the channel layer 220' are exposed and portions of a third surface 235a and a fourth surface 235b on two sides of the barrier layer 230' are exposed.

Figure 2C:
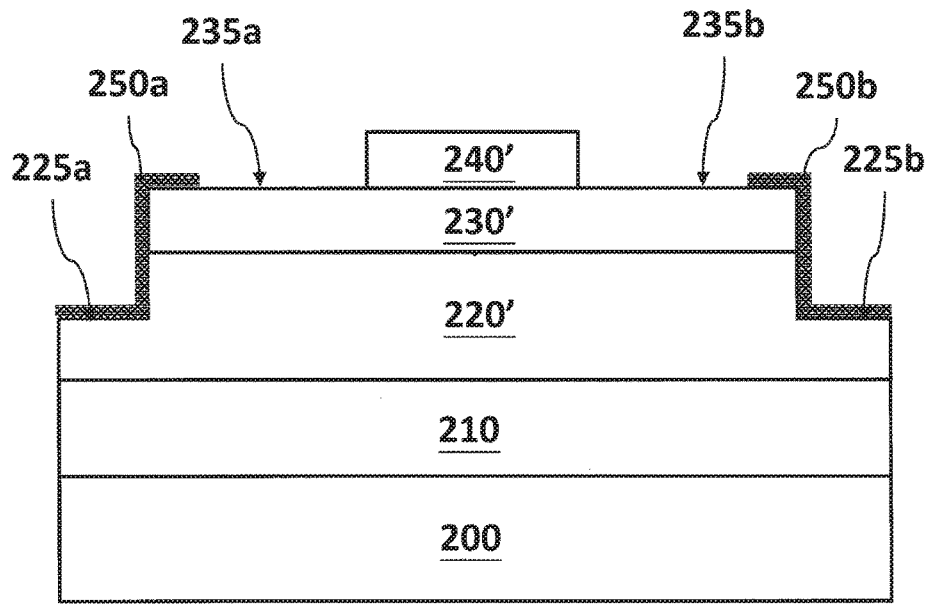

In FIG. 2C, a first electrode hereinafter also referred to as a first cathode 250a is formed on the exposed third surface 235a of one side of the barrier layer 230' and extends from an edge of the third surface 235a to the exposed first surface 225a on one side of the channel layer 220'. Additionally, a third electrode hereinafter also referred to as a second cathode 250b is formed on the exposed fourth surface 235b of another side of the barrier layer 230' and extends from an edge of the fourth surface 235b to the exposed second surface 225b of another side of the channel layer 220'.

Figure 2D:
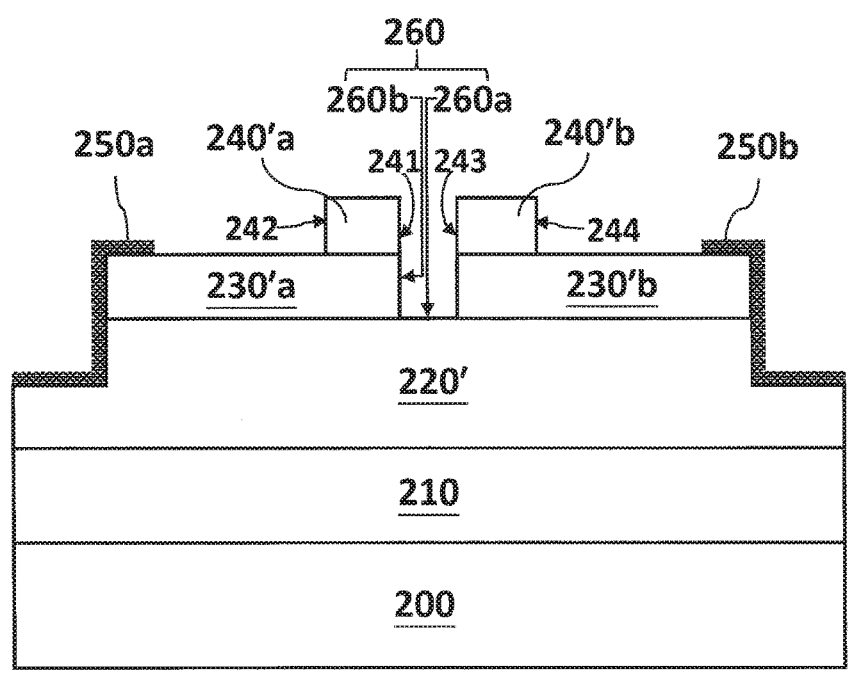

In FIG. 2D, a portion of the barrier layer 230' and the cap layer 240' is removed to form a trench 260, and the trench 260 has a bottom wall 260a exposing a surface of the channel layer 220' and a side wall 260b on two sides of the bottom wall 260a. Additionally, the barrier layer 230' on two sides of the trench 260 is defined as a first barrier layer 230'a and a second barrier layer 230'b, and the cap layer 240' on two sides of the trench 260 is defined as a first cap layer 240'a and a second cap layer 240'b. Moreover, the first cap layer 240'a has a first edge 241 near the trench 260 and a second edge 242 away from the trench 260, and the second cap layer 240'b has a fifth edge 243 near the trench 260 and a sixth edge 244 away from the trench 260.

Figure 2E:
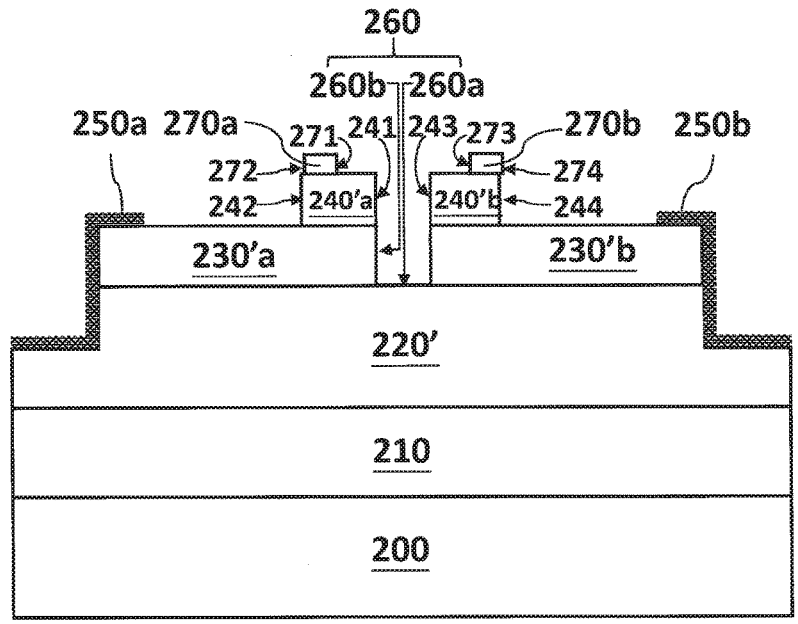
Figure 2F:
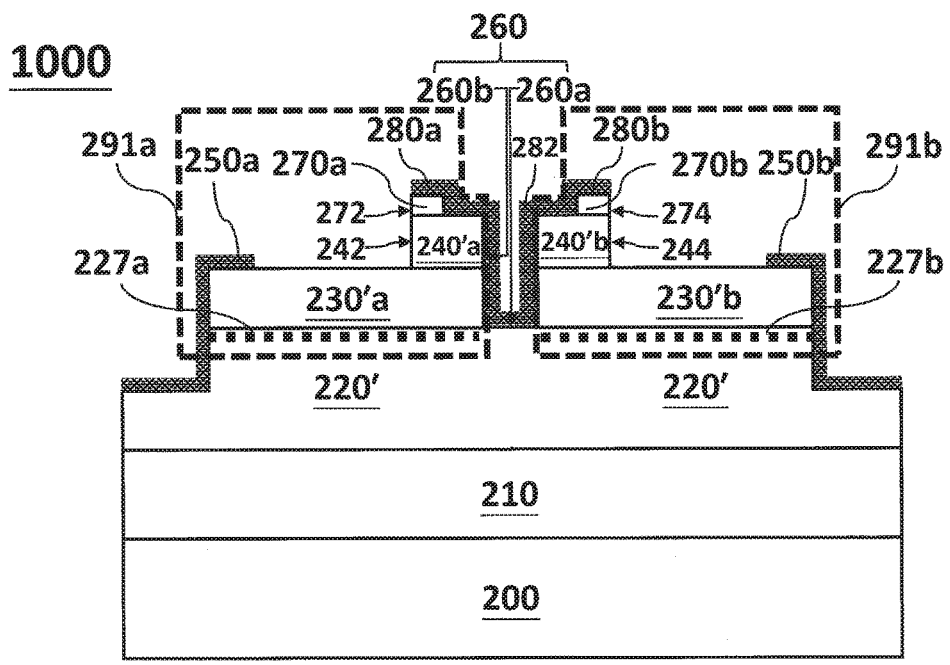

In FIG. 2E, a first ohmic contact layer 270a and a second ohmic contact layer 270b are formed on the first cap layer 240'a and the second cap layer 240'b which are disposed on two sides of the trench 260, respectively. The first ohmic contact layer 270a has a third edge 271 near the trench 260 and a fourth edge 272 away from the trench 260. The second ohmic contact layer 270b has a seventh edge 273 near the trench 260 and an eighth edge 274 away from the trench 260. In the embodiment, the second edge 242 of the first cap layer 240'a is aligned with the fourth edge 272 of the first ohmic contact layer 270a, and the sixth edge 244 of the second cap layer 240'b is aligned with the eighth edge 274 of the second ohmic contact layer 270b. In the embodiment, thicknesses of the first ohmic contact layer and the second ohmic contact layer 270b range between 50 nm and 200 nm, for example, 100 nm. Materials thereof can include a metal oxide, for example, indium tin oxide (ITO) or indium zinc oxide (IZO); a metal, for example, nickel (Ni), gold (Au), or an alloy of nickel gold (NiAu).

In FIG. 2F, a second electrode hereinafter also referred to as a first anode 280a and a fourth electrode hereinafter also referred to as a$_{[DX1]}$ a second anode 280b are formed on the first ohmic contact layer 270a and the second ohmic contact layer 270b, respectively. Additionally, a connecting portion 282 is disposed between the first anode 280a and a second anode 280b and covers the bottom wall 260a and a side wall 260b of the trench 260. The first anode 280a is electrically connected with the second anode 280b via the connecting portion 282, and a schottky contact is formed between the connecting portion 282 and the exposed channel layer 220'. Moreover, two dimensional electron gases 227a and 227b are formed between the channel layer 220' and the first barrier layer 230'a and between the channel layer 220' and the second barrier layer 230'b, respectively. By doing so, the high power semiconductor device 1000 disclosed in the first embodiment of the application is disclosed.

The high power semiconductor device 1000 disclosed in the embodiment includes a structure disposed on the substrate 200 and constructed by the channel layer 220', the first barrier layer 230'a, the first cap layer 240'a, the first ohmic contact layer 270a, the first cathode 250a, and the first anode 280a, wherein the first cap layer 240'a includes p-type impurities, the channel layer 220' includes negative charges constructed of a two dimensional electron gas 227a, and the first barrier layer 230'a includes positive charges coupling with the negative charges. The structure can be regarded as a first PIN diode structure 291a. The high power semiconductor device of the embodiment further includes a second PIN diode structure 291b disposed on the substrate 200 and constructed by the channel layer 220', the second barrier layer 230'b, the second cap layer 240'b, the second ohmic contact layer 270b, the second cathode 250b, and the second anode 280b. In one embodiment, the first PIN diode structure 291a and the second PIN diode structure 291b on the substrate 200 are connected with the first anode 280a and the second anode 280b respectively through the connecting portion 282 so that they are electrically connected in parallel. Additionally, a schottky-interface structure is formed by a schottky contact between the connecting portion 282 and the exposed channel layer 220'.

In the condition of operating the high power semiconductor device 1000 under forward bias, when an anode-to-cathode voltage $V_{ac}$ is greater than an initial voltage of the schottky contact interface $V_{schottky, th}$, for example, 0.8 V, the forward turn-on current flows from the first anode 280a and the second anode 280b via the connecting portion 282 and the schottky interface between the connecting portion 282 and the channel layer 220', through the two dimensional electron gases 227a, 227b to the first cathode 250a and the second cathode 250b. When the anode-to-cathode voltage $V_{ac}$ is greater than an initial voltage of the PIN diode $V_{PIN, th}$, for example, 3 V~5 V, the first PIN diode structure 291a and the second PIN diode structure are conductive and an extra forward turn-on current is provided so as to increase the forward turn-on current of the device 1000. Additionally, the first ohmic contact layer 270a and the second ohmic contact layer 270b are respectively formed between the first cap layer 240'a and the first anode 280a and between the second cap layer 240'b and the second anode 280b to lower contact resistances therebetween so that a low-resistance contact, for example, an ohmic contact, is formed, and more forward turn-on current injects to the device 1000 under a positive bias. Under a reversed bias, defective electrons in the first barrier 230'a and the second barrier 230'b are absorbed by the first cap layer 240'a and the second cap layer 240'b so leakage currents can be avoided and breakdown voltage can be increased.

Through the connecting portion 282 each of the first anode 280a and the second anode 280b forms a schottky contact with the channel layer 220' which is exposed by the bottom wall 260a of the trench 260, and is electrically connected with the two dimensional gas so as to lower a schottky barrier, the turn-on voltage, and the turn-on resistance. Moreover, the first cathode 250a contacts the first barrier 230'a and the channel layer 220' at the same time and the second cathode 250b contacts the second barrier 230'b and the channel layer 220' at the same time, so that the two dimensional electron gases 227a and 227b and currents from other current paths, for example, the current between the barrier layer and the channel layer, can be received by the cathodes 250a and 250b. Therefore, the turn-on resistance can be reduced and the forward current can be increased.

Figure 3:
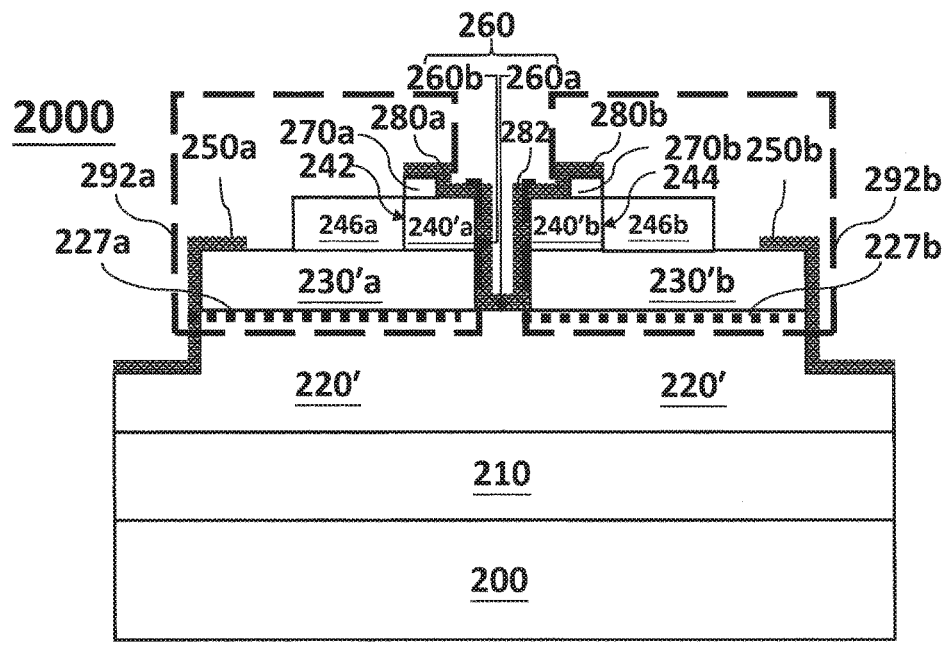
FIG. 3 show a cross-sectional view of a high power semiconductor device 2000 in accordance with a second embodiment of the present application.

FIG. 3 shows a cross-sectional view of a high power semiconductor device 2000 in accordance with a second embodiment of the present application. The high power semiconductor device 2000 is similar to the high power semiconductor device 1000 disclosed in the first embodiment and both of them include a structure disposed on a substrate 200 and a buffer layer 210 and constructed by a channel layer 220', a first barrier layer 230'a, a second barrier layer 230'b, a first cap layer 240'a which can be a semiconductor layer with a conductivity type, for example, a p-type conductivity, a second cap layer 240'b which can be a semiconductor layer with a conductivity type, for example, a p-type conductivity, a first ohmic contact layer 270a, a second ohmic contact layer 270b, a first cathode 250a, a second cathode 250b, a first anode 280a, and a second anode 280b. Herein, the difference between the high power semiconductor device 2000 and the high power semiconductor 1000 is the high power semiconductor device 2000 further includes a third cap layer 246a that includes a p-type semiconductor layer doped by p-type impurities therein and is formed on the first barrier layer 230'a, wherein the third cap layer 246a is connected to a second edge 242 of the first cap layer 240'a; a fourth cap layer 246b formed on the second barrier layer 230'b wherein both of the fourth cap layer 246b and the third cap layer 246a are p-type semiconductor layers and the fourth cap layer 246b is connected to a sixth edge 244 of the second cap layer 240'b. Additionally, in this embodiment, a thickness of the third cap layer 246a is the same as that of the first cap layer 240'a, and a thickness of the fourth cap layer 246b is the same as the second cap layer 240'b. In one embodiment, the third cap layer 246a and the first cap layer 240'a can be formed in the same process, and the fourth cap layer 246b and the second cap 240'b can be formed in the same process.

In the embodiment, the first cap layer 240'a and the third cap layer 246a include positive charges constructed by p-type impurities, the channel layer 220' includes negative charges constructed by the two dimensional electron gas 227a, and the first barrier 230'a includes electric dipoles formed by coupling the positive charges and the negative charge, which can be regarded as a first PIN diode structure 292a. Similarly, the second cap layer 240'b, the fourth cap layer 246b, the channel layer 220', and the second barrier layer 230'b form a second PIN diode structure 292b. In one embodiment, the first PIN diode structure 292a and the second PIN diode structure 292b on the substrate 200 are respectively connected to the first anode 280a and the second anode 280b via the connecting portion 282 so that they are electrically connected with each other in parallel. Moreover, a schottky-interface structure is constructed by forming a schottky contact between the connecting portion 282 and the channel layer 220' exposed by the trench 260.

Figure 4:
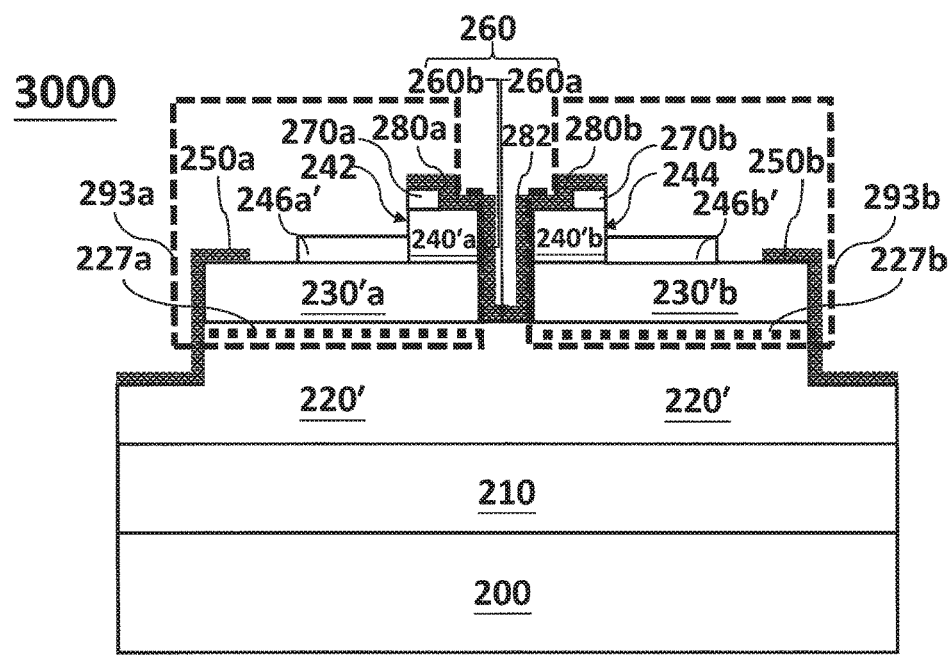
FIG. 4 show a cross-sectional view of a high power semiconductor device 3000 in accordance with a third embodiment of the present application.

FIG. 4 shows a cross-sectional view of a high power semiconductor device 3000 in accordance with a third embodiment of the present application. The high power semiconductor device 3000 shown in FIG. 4 is similar to the high power semiconductor device 2000 disclosed in the second embodiment and includes a structure disposed on a substrate 200 and a buffer layer 210 and constructed by a channel layer 220', a first barrier layer 230'a, a second barrier layer 230'b, a first cap layer 240'a which can be a semiconductor layer with a conductivity type, for example, a p-type conductivity, a second cap layer 240'b which can be a semiconductor layer with a conductivity type, for example, a p-type conductivity, a first ohmic contact layer 270a, a second ohmic contact layer 270b, a first cathode 250a, a second cathode 250b, a first anode 280a, and a second anode 280b. Herein, the difference between the high power semiconductor device 3000 and the high power semiconductor 2000 is that a second edge 242 of the first cap layer 240'a of the high power semiconductor device 3000 is connected to a third cap layer 246a' which can be a semiconductor layer with a conductivity type, for example, a p-type conductivity and has a thickness thinner than that of the first cap layer 240'a, wherein the thickness of the third cap layer 246a' is smaller than 30 Å. Additionally, a sixth edge 244 of the second cap layer 240'b of the high power semiconductor device 3000 is connected to a fourth cap layer 246b' which can be a semiconductor layer with a conductivity type, for example, a p-type conductivity and has a thickness thinner than that of the second cap layer 240'b wherein the thickness of the fourth cap layer 246b' is smaller than 30 Å. In one embodiment, the third cap layer 246a' and the first cap layer 240'a can be formed by the same process of forming a p-type semiconductor layer and then etching and thinning the p-type semiconductor to form the third cap layer 246a'; the fourth cap layer 246b' and the second cap layer 240'b can be formed by the same process of forming other p-type semiconductor layer and then etching and thinning the other p-type semiconductor layer to form the fourth cap layer 246b'. Thicknesses of the third cap layer 246a' and the fourth cap layer 246b' are reduced to smaller than 30 Å. With such thickness, the influence of the electric field on the two dimensional electron gases under a forward bias, which is caused by the p-type impurities of the cap layer, can be reduced so an overhigh forward turn-on voltage can be avoided.

In the embodiment, the first cap layer 240'a and the third cap layer 246a' include positive charges constructed by p-type impurities, the channel layer 220' includes negative charges constructed by two dimensional electron gas 227a, and the first barrier 230'a includes electric dipoles formed by coupling the positive charges and the negative charges, which can be regarded as a first PIN diode structure 293a. Similarly, the second cap layer 240'b, the fourth cap layer 246b', the channel layer 220', and the second barrier layer 230'b form a second PIN diode structure 293b. In one embodiment, the first PIN diode structure 293a and the second PIN diode structure 293b on the substrate 200 are respectively connected to the first anode 280a and the second anode 280b via the connecting portion 282 so that they are electrically connected to each other in parallel and a schottky-interface structure is constructed by forming a schottky contact between the connecting portion 282 and the channel layer 220' exposed by the trench 260.

Figure 1B:
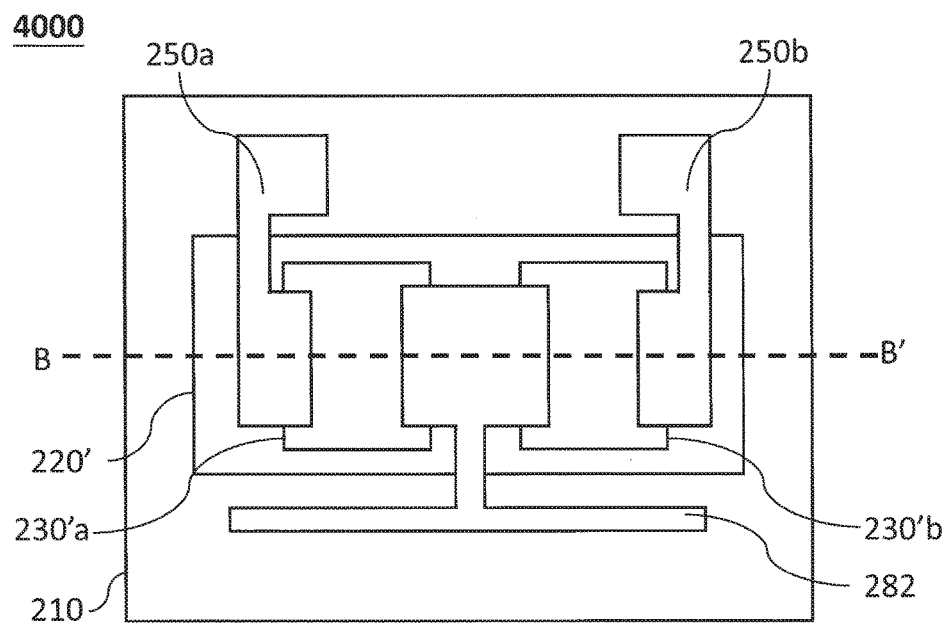
FIG. 1B shows a top view of a high power semiconductor device 4000 in accordance with a fourth embodiment of the present application.
Figure 5:
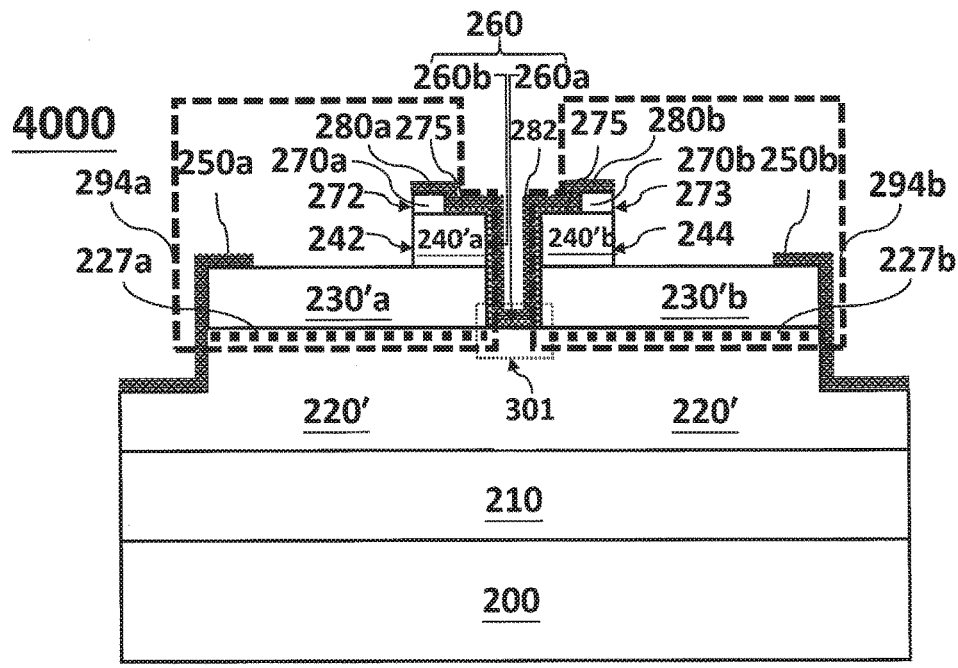
FIG. 5 show a cross-sectional view of a high power semiconductor device 4000 in accordance with the fourth embodiment of the present application.

FIG. 1B shows a top view of a high power semiconductor device 4000 in accordance with the fourth embodiment of the present application. FIG. 5 shows a cross-sectional view taken along a line B-B' of the high power semiconductor device 4000 as shown in FIG. 1B.

FIG. 5 shows a cross-sectional view of the high power semiconductor device 4000 in accordance with the fourth embodiment of the present application. The high power semiconductor device 4000 shown in FIG. 5 is similar to the high power semiconductor device 1000 disclosed in the first embodiment and includes a structure disposed on a substrate 200 and a buffer layer 210 and constructed by a channel layer 220', a first barrier layer 230'a, a second barrier layer 230'b, a first cap layer 240'a, a second cap layer 240'b, a first ohmic contact layer 270a, a second ohmic contact layer 270b, a first cathode 250a, a second cathode 250b, a first anode 280a, and a second anode 280b. Herein, the difference between the high power semiconductor device 4000 and the high power semiconductor device 1000 is the high power semiconductor device 4000 further includes a dielectric layer 275 formed among a connecting portion 282, a side wall 260b, a bottom wall 260a, the first cap layer 240'a, and the second cap layer 240'b. By the dielectric layer 275, the high power semiconductor device 4000 with high breakdown voltage, low turn-on voltage, and low turn-on resistance, for example, an enhanced high electron mobility transistor (E-mode HEMT), is formed. Herein, the first cathode 250a can be a source electrode of the enhanced high electron mobility transistor, and the second cathode 250b can be a drain electrode of the enhanced high electron mobility transistor. Additionally, a gate structure of the enhanced high electron mobility transistor includes a first gate portion constructed by the first anode 280a, a second gate portion constructed by the second anode 280b, and the connecting portion 282 disposed on the dielectric layer 275 of the bottom wall 260a. In the embodiment, a material of the dielectric layer 275 can include silicon nitride, silicon oxide, and silicon oxynitride.

In the condition of operating the high power semiconductor device 4000 under a forward bias, when an gate-to-source voltage $V_{GS}$ is greater than an initial voltage of the device $V_{th}$, for example, 0.8 V, concentrations of two dimensional electron gases below the first anode 280a, the second anode 280b, and the connecting portion 282 can be increased, and a forward turn-on current flows from the first cathode 250a regarded as the source electrode through the two dimensional electron gases 227a and 227b to the second cathode 250b regarded as the drain electrode. In the condition of operating the high power semiconductor device 4000 under a reversed bias, electrical fields of the first cap layer 240'a and the second cap layer 240'b lowers the concentrations of the two dimensional electron gases below the first anode 280a, the second anode 280b, and the connecting portion 282 so as to prevent a leakage path from being formed by the connecting portion 282 and to reduce a gate leakage current of the device 4000. In one embodiment, the high power semiconductor device 4000 includes a substrate 200; a buffer layer 210 on the substrate 200; a channel layer 220' on the buffer layer 210; and a first semiconductor gate structure 294a, a metal-insulator-semiconductor gate structure 301 having a recess, and a second semiconductor gate structure 294b disposed on the channel layer 220' and electrically connected with one another in parallel. Herein, the first semiconductor gate structure 294a includes a first barrier layer 230'a; a first cap layer 240'a which can be a semiconductor layer with a conductivity type, for example, a p-type conductivity; a first ohmic contact layer 270a; and a first anode 280a. The second semiconductor gate structure 294b includes a second barrier layer 230'b; a second cap layer 240'b with a conductive type, for example, a p-type conductivity; a second ohmic contact layer 270b; and a second anode 280b. Additionally, the metal-insulator-semiconductor gate structure 301 includes a dielectric layer 275, a connecting portion 282 on the dielectric layer 275, and an interface between the dielectric layer 275 and the channel layer 220', wherein the connecting portion 282, the first anode 280a, and the second anode 280b are electrically connected with one another, and the first semiconductor gate structure 294a, the metal-insulator-semiconductor gate structure 301, and the second semiconductor gate structure 294b are electrically connected with one another via the connecting portion 282, the first anode 280a, and the second anode 280b. Materials of the first semiconductor gate structure 294a, the second semiconductor gate structure 294b, and the metal-insulator-semiconductor gate structure 301 and connecting approaches therebetween can be adjusted by operation characters of the high power semiconductor device 4000.

Figure 6:
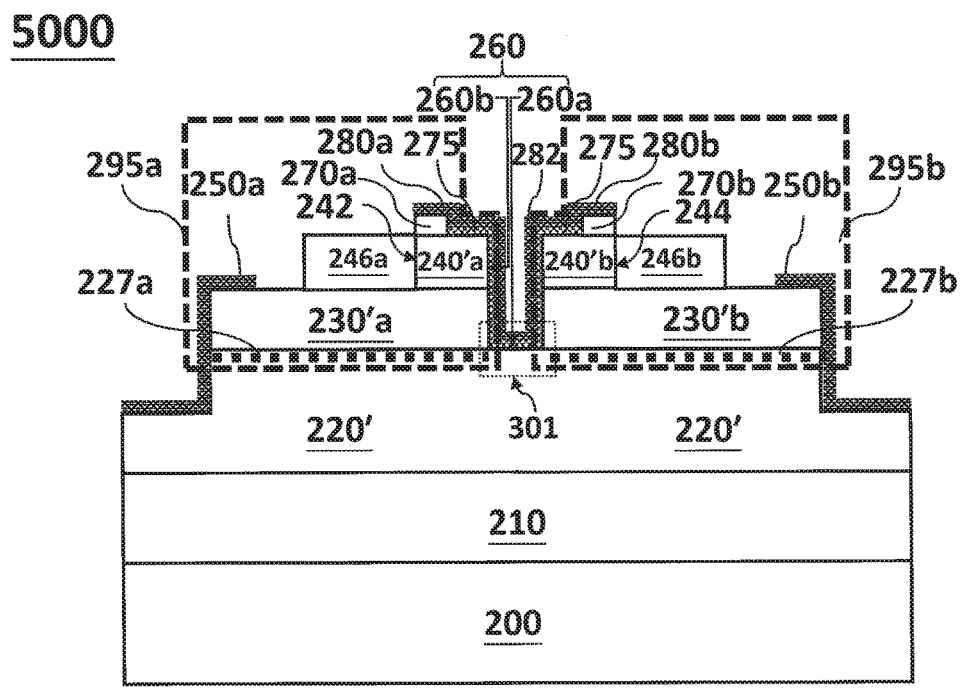
FIG. 6 show a cross-sectional view of a high power semiconductor device 5000 in accordance with the fifth embodiment of the present application.

FIG. 6 shows a cross-sectional view of the high power semiconductor device 5000 in accordance with the fifth embodiment of the present application. As shown in FIG. 6, the high power semiconductor device 5000 is similar to the high power semiconductor device 2000 disclosed in the second embodiment and includes a structure disposed on a substrate 200 and a buffer layer 210 and constructed by a channel layer 220', a first barrier layer 230'a, a second barrier layer 230'b, a first cap layer 240'a which can be a semiconductor layer with a conductivity type, for example, a p-type conductivity, a second cap layer 240'b which can be a semiconductor layer with a conductivity type, for example, a p-type conductivity, a third cap layer 246a which can be a semiconductor layer with a conductivity type, for example, a p-type conductivity, a fourth cap layer 246b which can be a semiconductor layer with a conductivity type, for example, a p-type conductivity, a first ohmic contact layer 270a, a second ohmic contact layer 270b, a first cathode 250a, a second cathode 250b, a first anode 280a, and a second anode 280b. Herein, the difference between the high power semiconductor device 5000 and the high power semiconductor device 2000 is the high power semiconductor device 5000 further includes a dielectric layer 275 formed among a connecting portion 282, a side wall 260b, a bottom wall 260a, the first cap layer 240'a, and the second cap layer 240'b. With the dielectric layer 275, the high power semiconductor device 5000 is high in breakdown voltage and low in turn-on voltage and turn-on resistance as an enhanced high electron mobility transistor (E-mode HEMT). Herein, the first cathode 250a can be a source electrode of the enhanced high electron mobility transistor and the second cathode 250b can be a drain electrode of the enhanced high electron mobility transistor. Additionally, a gate structure of the enhanced high electron mobility transistor includes a first gate portion constructed by the first anode 280a, a second gate portion constructed by the second anode 280b, and the connecting portion 282 disposed on the dielectric layer 275 of the bottom wall 260a. In the embodiment, a material of the dielectric layer 275 can include silicon nitride, silicon oxide, and silicon oxynitride. In one embodiment, the high power semiconductor device 5000 includes a substrate 200; a buffer layer 210 on the substrate 200; a channel layer 220' on the buffer layer 210; a first semiconductor gate structure 295a, a metal-insulator-semiconductor gate structure 301 having a recess, and a second semiconductor gate structure 295b disposed on the channel layer 220' and electrically connected with one another in parallel. Herein, the first semiconductor gate structure 295a includes a first barrier layer 230'a; a first cap layer 240'a which can be a semiconductor with a conductivity type, for example, a p-type conductivity; a third cap layer 246a which can be a semiconductor with a conductivity type, for example, a p-type conductivity; a first ohmic contact layer 270a; and a first anode 280a. The second semiconductor gate structure 295b includes a second barrier layer 230'b, a second cap layer 240'b which can be a semiconductor layer with a conductivity type, for example, a p-type conductivity, a fourth cap layer 246b which can be a semiconductor layer with a conductivity type, for example, a p-type conductivity, a second ohmic contact layer 270b, and a second anode 280b. Additionally, the gate structure 301 includes a dielectric layer 275, a connecting portion 282 on the dielectric layer 275, and an interface between the dielectric layer 275 and the channel layer 220', wherein the connecting portion 282, the first anode 280a, and the second anode 280b are electrically connected with one another, and the first semiconductor gate structure 295a, the metal-insulator-semiconductor gate structure 301, and the second semiconductor gate structure 295b are electrically connected with one another via the connecting portion 282, the first anode 280a, and the second anode 280b. Materials of the first semiconductor gate structure 295a, the second semiconductor gate structure 295b, and the metal-insulator-semiconductor gate structure 301 and methods for connecting the first semiconductor gate structure 295a, the second semiconductor gate structure 295b, and the metal-insulator-semiconductor gate structure 301 can be adjusted by operation requirement.

Figure 7:
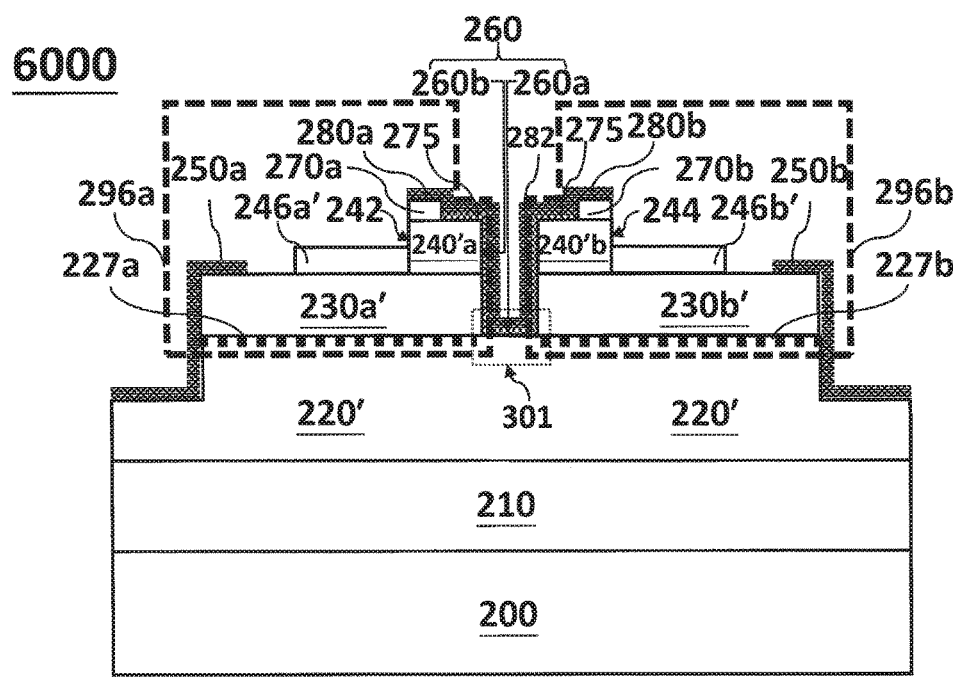
FIG. 7 show a cross-sectional view of a high power semiconductor device 6000 in accordance with the sixth embodiment of the present application.

FIG. 7 shows a cross-sectional view of the high power semiconductor device 6000 in accordance with the sixth embodiment of the present application. As shown in FIG. 7, the high power semiconductor device 6000 is similar to the high power semiconductor derive 3000 disclosed in the third embodiment and includes a structure disposed on a substrate 200 and a buffer layer 210 and constructed by a channel layer 220', a first barrier layer 230'a, a second barrier layer 230'b, a first cap layer 240'a which can be a semiconductor layer with a conductivity type, for example, a p-type conductivity, a second cap layer 240'b which can be a semiconductor layer with a conductivity type, for example, a p-type conductivity, a third cap layer 246a' which can be a semiconductor layer with a conductivity type, for example, a p-type conductivity, a fourth cap layer 246b' which can be a semiconductor layer with a conductivity type, for example, a p-type conductivity, a first ohmic contact layer 270a, a second ohmic contact layer 270b, a first cathode 250a, a second cathode 250b, a first anode 280a, and a second anode 280b. Herein, the difference between the high power semiconductor device 6000 and the high power semiconductor device 3000 is the high power semiconductor device 6000 further includes a dielectric layer 275 formed among a connecting portion 282, a side wall 260b, a bottom wall 260a, the first cap layer 240'a, and the second cap layer 240'b. As an enhanced high electron mobility transistor, with the dielectric layer 275, the high power semiconductor device 6000 has high breakdown voltage and low turn-on voltage and turn-on resistance. Herein, the first cathode 250a can be a source electrode of the high electron mobility transistor and the second cathode 250b can be a drain electrode of the high electron mobility transistor. Additionally, a gate structure of the enhanced high electron mobility transistor includes a first gate portion constructed by the first anode 280a, a second gate portion constructed by the second anode 280b, and the connecting portion 282 on the dielectric layer 275 of the bottom wall 260a. In the embodiment, a material of the dielectric layer 275 can include silicon nitride, silicon oxide, and silicon oxynitride. In one embodiment, the high power semiconductor device 6000 includes a substrate 200, a buffer layer 210 on the substrate 200, a channel layer 220' on the buffer layer 210, a first semiconductor gate structure 296a, a metal-insulator-semiconductor gate structure 301 having a recess, and a second semiconductor gate structure 296b disposed on the channel layer 220' and electrically connected with one another in parallel. Herein, the first semiconductor gate structure 296a includes a first barrier layer 230'a, a first cap layer 240'a which can be a semiconductor layer with a conductivity type, for example, a p-type conductivity, a third cap layer 246a' which can be a semiconductor layer with a conductivity type, for example, a p-type conductivity, a first ohmic contact layer 270a, and a first anode 280a. The second semiconductor gate structure 296b includes a second barrier layer 230'b, a second semiconductor layer 240'b with a conductive type, for example, a p-type conductivity, a fourth cap layer 246b' which can be a semiconductor layer with a conductivity type, for example, a p-type conductivity, a second ohmic contact layer 270b, and a second anode 280b. Additionally, the gate structure 301 includes a dielectric layer 275, a connecting portion 282 on the dielectric layer 275, and an interface between the dielectric layer 275 and the channel layer 220'. Herein the connecting portion 282, the first anode 280a, and the second anode 280b are electrically connected with one another. Moreover, the first semiconductor gate structure 296a, the gate structure 301, and the second semiconductor gate structure 296b are electrically connected with one another via the connecting portion 282, the first anode 280a, and the second anode 280b. Materials of the first semiconductor gate structure 296a, the second semiconductor gate structure 296b, and the metal-insulator-semiconductor gate structure 301 and methods for connecting the first semiconductor gate structure 296a, the second semiconductor gate structure 296b, and the metal-insulator-semiconductor gate structure 301 can be adjusted by operation characters of the high power semiconductor device 6000.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A high power semiconductor device comprising:
   a substrate;
   a channel layer formed on the substrate and comprising a first region, a second region, and a third region;
   a first barrier layer formed on the first region of the channel layer;
   a first cap layer having a first conductivity type and formed on the first barrier layer;
   a first electrode formed on the first barrier layer;
   a second electrode formed on the first cap layer;
   a second barrier layer formed on the second region of the channel layer;
   a second cap layer having the first conductivity type and formed on the second barrier layer;
   a third electrode formed on the second barrier layer;
   a fourth electrode formed on the second cap layer;
   a trench comprising a bottom wall and being disposed between the first barrier layer and the second barrier layer, wherein the trench exposes the third region of the channel layer; and
   a connecting portion covering the bottom wall of the trench, electrically connected with the second electrode and the fourth electrode, and forming a schottky contact with the third region of the channel layer.

2. The high power semiconductor device as claimed in claim 1, wherein the first electrode and a portion of the third electrode are formed on the channel layer.

3. The high power semiconductor device as claimed in claim 1, further comprising a buffer layer disposed between the substrate and the channel layer, and a dielectric layer formed among the connecting portion, the bottom wall, the first cap layer, and the second cap layer.

4. The high power semiconductor device as claimed in claim 3, wherein a material of the dielectric layer comprises silicon nitride, silicon oxide, or silicon oxynitride.

5. The high power semiconductor device as claimed in claim 1, further comprising:
   a first ohmic contact layer formed on the first cap layer; and
   a second ohmic contact layer formed on the second cap layer, wherein the second electrode is formed on the first ohmic contact layer, and the fourth electrode is formed on the second ohmic contact layer.

6. The high power semiconductor device as claimed in claim 5, wherein the first cap layer comprises a first edge away from the trench, the first ohmic contact layer comprises a second edge away from the trench, the second layer comprises a third edge away from the trench, the second ohmic contact layer comprise a fourth edge away from the trench, the first edge is aligned with the second edge, and/or the third edge is aligned with the fourth edge.

7. The high power semiconductor device as claimed in claim 6, comprising a third cap layer having a first conductivity type and next to the first edge of the first cap layer, and a fourth cap layer having the first conductivity type and next to the third edge of the second cap layer.

8. The high power semiconductor device as claimed in claim 7, wherein a thickness of the third cap layer is equal to or smaller than a thickness of the first cap layer, and a thickness of the fourth cap layer is equal to or smaller than a thickness of the second cap layer.

9. The high power semiconductor device as claimed in claim 7, wherein a thickness of the third cap layer and a thickness of the fourth cap layer are smaller than 30 Å.

10. A high power semiconductor device comprising:
    a substrate;
    a first PIN diode structure disposed on the substrate;
    a second PIN diode structure disposed on the substrate; and
    a schottky-interface structure disposed on the substrate and between the first PIN diode structure and the second PIN diode structure, wherein the first PIN diode structure, the second PIN diode structure, and the schottky-interface structure are electrically connected with one another in parallel.

11. A high power semiconductor device comprising:
    a substrate;
    a channel layer disposed on the substrate;
    a first semiconductor gate structure disposed on the channel layer;
    a metal-insulator-semiconductor gate structure disposed on the channel layer and having a recess; and
    a second semiconductor gate structure disposed on the channel layer;
    wherein the first semiconductor gate structure, the metal-insulator-semiconductor gate structure, and the second semiconductor gate structure are electrically connected with one another in parallel.

12. The high power semiconductor as claimed in claim 11, wherein the first semiconductor gate structure comprises a first electrode, the metal-insulator-semiconductor gate structure comprises a first connecting portion, the second semiconductor gate structure comprises a second electrode, and the connecting portion is electrically connected to the first electrode and the second electrode.

* * * * *